United States Patent [19]  [11] 4,378,503
Rautiola  [45] Mar. 29, 1983

[54] AUTOMOTIVE BACKLIGHT HEATER AND TIMING CONTROL MEANS

[76] Inventor: Norman A. Rautiola, 430 W. Upton, Reed City, Mich. 49684

[21] Appl. No.: 367,376

[22] Filed: Apr. 12, 1982

Related U.S. Application Data

[63] Continuation of Ser. No. 119,213, Feb. 7, 1980, abandoned.

[51] Int. Cl.³ .............................................. B62D 45/00
[52] U.S. Cl. .................................. 307/10 R; 335/164; 361/195; 361/399; 307/141
[58] Field of Search ...................... 307/10 R, 141, 590, 307/597; 361/194–202, 395, 399; 219/203, 492; 335/164

[56] References Cited

U.S. PATENT DOCUMENTS

3,573,558 4/1971 Babcock .............................. 361/399
4,276,483 6/1981 Hayden .............................. 307/10 R Primary Examiner—L. T. Hix
Assistant Examiner—D. Jennings
Attorney, Agent, or Firm—Lon H. Romanski

[57] ABSTRACT

An electrical switching and timing assembly is shown having a manually actuatable switch selectively closable and openable, an associated electrical circuit has an input end and an output end, the input end is intended for connection to a source of electrical potential while the output end is intended for connection to an electrical load, the associated circuit has a timing circuit effective for opening the associated circuit within a preselected span of time after the associated circuit has been closed by the manually actuatable switch, the manually actuatable switch being effective for opening the associated circuit even before the expiration of the preselected span of time; the circuit means, manually actuatable switch means, the input and output ends and timing circuit are carried by unitized support structure.

16 Claims, 16 Drawing Figures

AUTOMOTIVE BACKLIGHT HEATER AND TIMING CONTROL MEANS

This is a continuation, of application Ser. No. 119,213, filed Feb. 7, 1980, abandoned.

FIELD OF INVENTION

This invention relates generally to the field of relatively high current switching and timing means and more particularly to such switching and timing means employable as for controlling automotive window heaters or the like whereby relatively high electrical current is supplied to the window heater for a limited period of time as, for example, in the order of ten minutes.

BACKGROUND OF THE INVENTION

Heretofore, the prior art has proposed the use of various electrical switching means and structures whereby, for example, the vehicle operator manually actuated such switching means to an electrically closed condition to thereby supply electrical current to the vehicular window heaters and, subsequently, upon some indeterminate span of time, the vehicle operator would manually actuate such closed switching means to an electrically open condition to thereby terminate electrical current to the window heaters. Such manual control often resulted in the operator forgetting to open the switching means thereby resulting in an attendant excessive current drain as on the vehicular battery.

In an attempt to overcome this problem, the prior art has proposed the employment of various timing circuits to be employed, in effect, in combination with the switching means in order to thereby limit the total time, as per any one occurrence of switch means closure, to a preselected maximum span of time. Such prior art devices have not been found acceptable for various reasons among which are that such prior art timing means usually exhibited variable time spans, instead of a substantially constant time span as desired and they are very sensitive to temperature and as a consequence thereof any one prior art timing means often exhibited variations in its timing function with such variations being temperature induced. Further, such prior art devices are usually quite complex requiring many electrical connections and other special considerations as in the installation thereof within an automotive vehicle. For example, some prior art systems proposed the use of physically separate circuitry which in turn had to be connected as by plug-in type terminals to related timing circuit means and to remotely situated manually actuated switching means and the circuitry then, in turn, also had to be connected as by electrical harness means to a source of electrical potential and to the vehicular backlight heater means.

Accordingly, the invention as herein disclosed, described and claimed is primarily directed to the solution of the foregoing and other related and attendant problems of the prior art.

SUMMARY OF THE INVENTION

According to the invention, an electrical switching and timing assembly comprises a unitary assembly in turn comprising manually actuatable switch means selectively manually closable and openable, circuit means having an input end and an output end, said input end being adapted for electrical connection to a source of electrical potential, said output end being adapted for electrical connection to associated electrical load means, said circuit means comprising electrical timing means effective for opening said circuit means within a preselected span of time after said circuit means has been closed by said manually actuatable switch means, and wherein said manually actuatable switch means is effective for opening said circuit means even before the expiration of said preselected span of time.

Various general and specific objects, advantages and aspects of the invention will become even more apparent when reference is made to the following detailed description of the invention considered in conjunction with the accompanying drawings.

BRIEF DESCRIPTION OF THE DRAWINGS

In the drawings wherein for purposes of clarity certain details and/or elements may be omitted from one or more views.

DETAILED DESCRIPTION OF THE PREFERRED EMBODIMENT

Figures 1, 2:
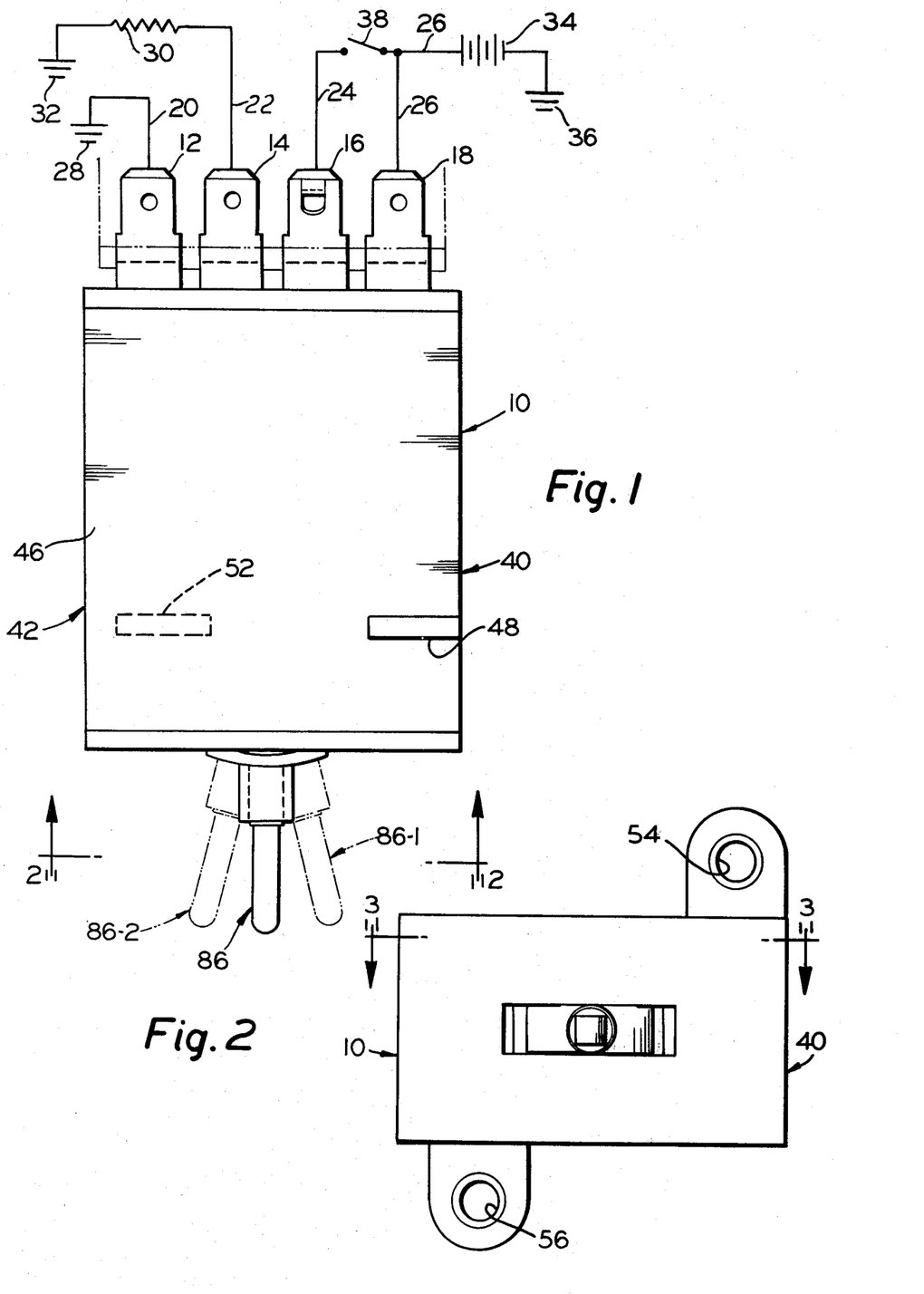
FIG. 1 is what may be considered a top plan view of a switch control and timing circuit assembly embodying teachings of the invention shown, schematically, operatively connected to a source of electrical potential and a related electrical load the energization and de-energization of which is controlled by said assembly.
FIG. 2 is what may be considered as a front elevational view of the assembly of FIG. 1 taken generally on the plane of line 2—2 of FIG. 1 and looking in the direction of the arrows.

Referring now in greater detail to the drawings, FIG. 1 illustrates a heater and timing control assembly 10, as in top plan view, having terminals 12, 14, 16 and 18 which are connected as by conductor means 20, 22, 24 and 26 to various electrical components and circuit portions. That is, terminal 12 is electrically connected as via conductor means 20 to ground as at 28; terminal 14 is electrically connected as via conductor 22 to the related vehicular electrical window heater means 30 which, in turn, is electrically connected to ground as at 32; terminal 18 is electrically connected as via conductor means 26 as to the positive side of a source of electrical potential as, for example, battery means 34 which may be grounded as at 36. Terminal 16 is electrically connected to the source of electrical potential as via conductor means and vehicular operator actuated ignition switch means 38.

The assembly 10 is illustrated as comprising housing means 40 which, in turn comprises, preferably a plastic molded main body portion 42 having a forwardly (illustrated as downward in FIG. 1) disposed open end 44. Preferably the upper disposed wall 46 of housing body portion 42 is provided with an integrally formed mounting tab 48 while the lower disposed wall 50 of housing body portion 42 is preferably provided with an integrally formed mounting tab 52. As best seen in FIG. 2, mounting tabs 48 and 52 are respectively provided with apertures 54 and 56 as for the accommodation of mounting screws or the like therethrough.

Figure 3:
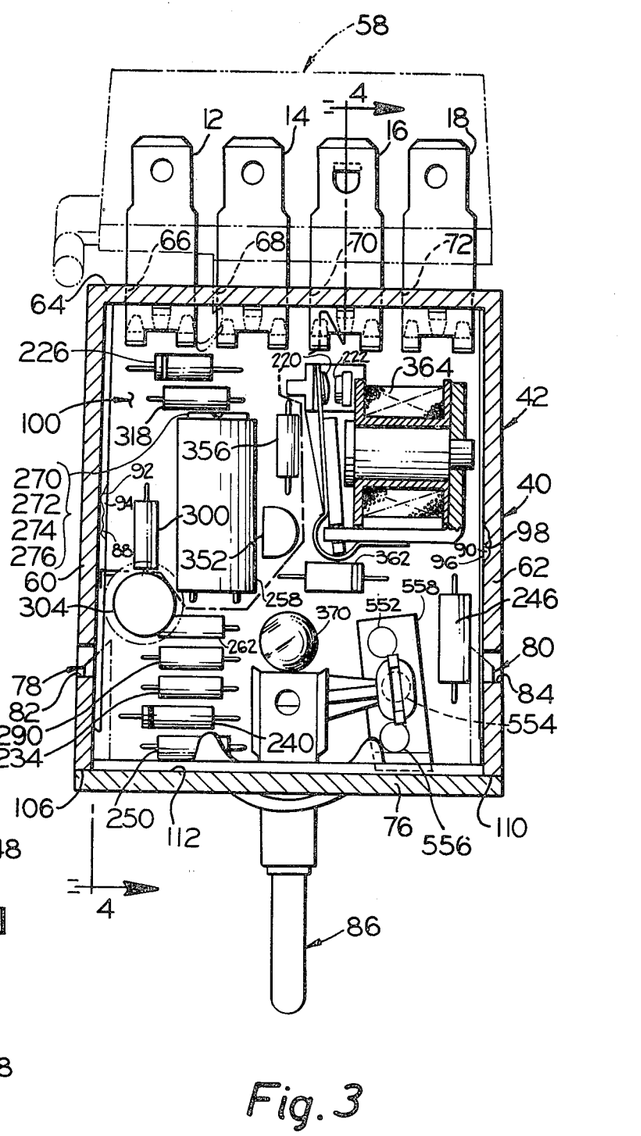
FIG. 3 is a relatively enlarged cross-sectional view taken generally on the plane of line 3—3 of FIG. 2 and looking in the direction of the arrows.
Figure 4:
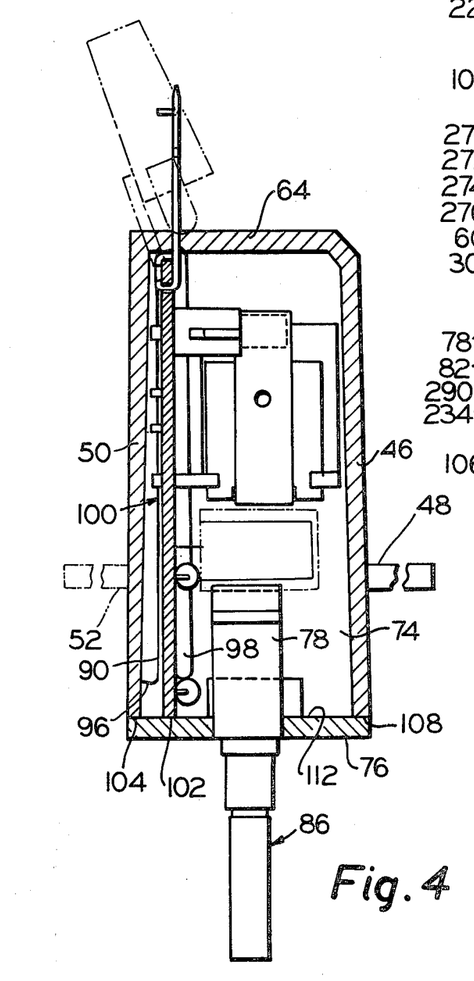
FIG. 4 is a cross-sectional view taken generally on the plane of line 4—4 of FIG. 3 and looking in the direction of the arrows.

FIGS. 3 and 4 illustrate, in cross-section, further details of the preferred embodiment of the assembly 10. Referring in greater detail to FIGS. 3 and 4, the terminals 12, 14, 16 and 18 are illustrated as being collectively connected as to a suitable terminal connector member 58 which, as well known in the art, carries suitable coacting terminals or contacts for electrical closure with terminals 12, 14, 16 and 18, respectively, in order to thereby achieve the circuitry depicted in FIG. 1. As can be seen, the housing main body portion 42 is preferably composed of integrally formed top 46 and bottom 50 walls along with side walls 60 and 62 each of which are integrally joined as at their respective rearward ends with a rear wall 64 which, in turn, is provided with a plurality of clearance apertures or slots 66, 68, 70 and 72 for respectively accommodating the passage therethrough of terminals 12, 14, 16 and 18. Walls 46, 50, 60, 62 and 64 cooperate to define an internal chamber 74 which serves to contain the various related electrical components as well as at least a portion of the manually actuatable switching means each to be described in greater detail. The forward (illustrated as downward in FIGS. 3 and 4) open end of housing main body portion 42 is closed as by a transversely extending wall member 76 detachably securable to the main body portion 42 as by resiliently deflectable arms 78 and 80 which respectively cooperate with recess or abutment like portions 82 and 84. The forwardly situated wall 76 also serves to carry the manually actuatable switching member operatively connected to manually actuatable handle or lever means 86 to be described in greater detail.

As shown in FIGS. 3 and 4, internally formed guide and supporting slots 88 and 90 are respectively formed as by spaced longitudinally extending flange-like portions 92 and 94 along the inner surface of side wall 60 and spaced longitudinally extending flange-like portions 96 and 98 along the inner surface of side wall 62. A printed circuit board 100, carrying various electrical circuit portions and electrical components, having terminals 12, 14, 16 and 18 secured thereto, is slidably received as generally along its opposite side edges within guide slots 88 and 90 as to be thereby supported therewithin. When the printed circuit board 100 and components carried thereby are completely received within chamber 74, and supported by guides 92 and 90, the terminals 12, 14, 16 and 18 extend through their cooperating slots as to assume positions as generally depicted in FIGS. 3 and 4 while the forward edge or end 102 of printed circuit board 100 is brought into general planar alignment as with the forward edge or end surfaces 104, 106, 108 and 110 of walls 50, 60, 46 and 62. Accordingly, when front wall member 76 is brought into assembled relationship with the main housing body 42 the inner surface 112 of wall member 76 ideally abuts against the forward edges 104, 106, 108 and 110 of main housing body 42 and, at the same time, abuts against the forward end 102 of printed circuit board 100 to thereby lock and hold the printed circuit board 100 in assembled condition.

Figure 5:
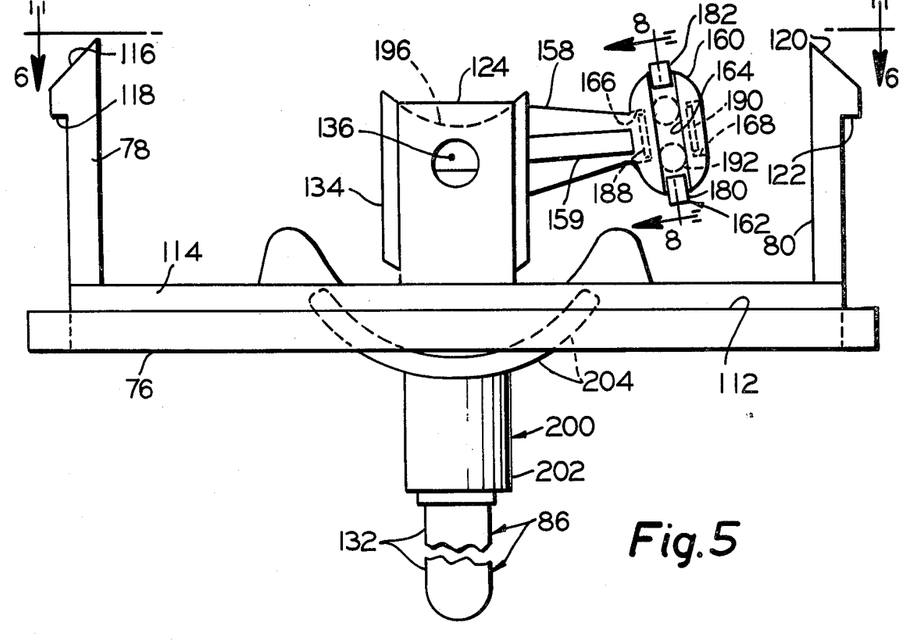
FIG. 5 is a top plan view, in relatively enlarged scale, of one of the sub-assemblies of the structure shown in FIG. 3.
Figure 6:
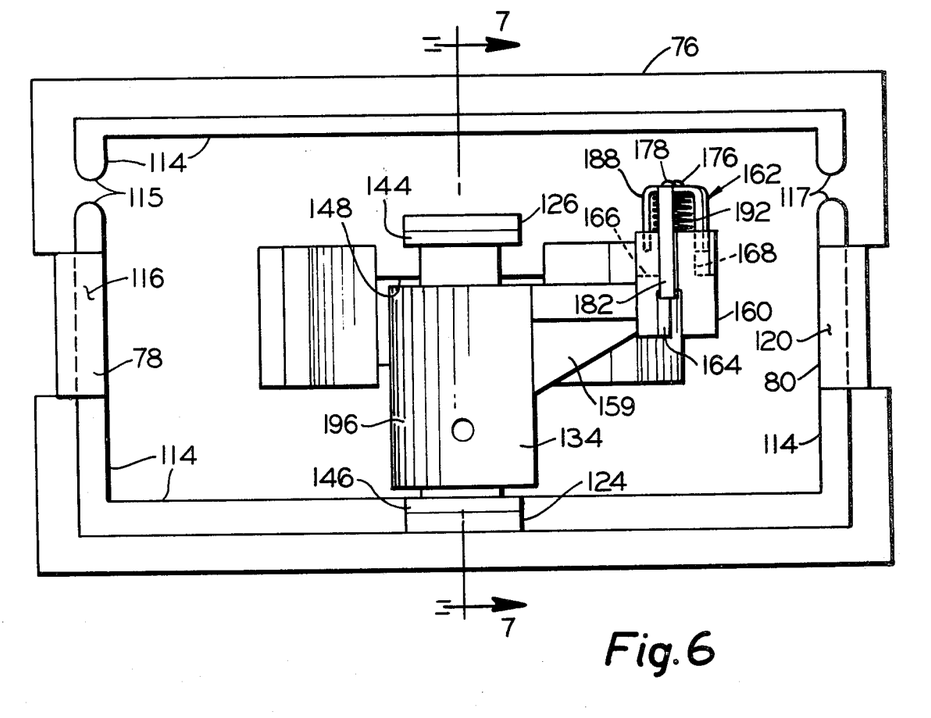
FIG. 6 is a view taken generally on the plane of line 6—6 of FIG. 5 and looking in the direction of the arrows.

FIG. 5 illustrates the forward wall member 76 and switch mechanism carried thereby in plan view, while FIG. 6 is a view taken generally on the plane of line 6—6 of FIG. 5 and looking in the direction of the arrows. Referring in greater detail to FIGS. 5 and 6 along with FIGS. 7 and 8 (FIG. 7 being a cross-sectional view taken in FIG. 6 and FIG. 8 being an enlarged cross-sectional view taken in FIG. 5) the forward wall member 76 and switching mechanism are illustrated as comprising an upstanding wall or flange-like portion 114, which may be discontinuous, integrally formed as with the inner surface 112 of wall 75, as to be situated generally inwardly from the outer periphery of the wall member 76. The flange-like portions 114 are closely received by the inner surfaces of housing main body portion 42 when wall member 76 is assembled as depicted in FIGS. 3 and 4. Preferably, flange portions 114 are discontinuous as at 115 and 117 thereby defining spaces which are in alignment, respectively, with guide support grooves 92 and 90 so that when the printed circuit board 100 and the front wall are assembled to the main housing body portion 42, the forward end of such printed circuit board 100 is received within such spaces defined at 115 and 117. Resiliently deflectable latching arms 78 and 80 are also preferably integrally formed with wall member 76 as to be extending rearwardly therefrom. The free end of arm 78 is provided with a forwardly disposed cam like surface 116 and a rearwardly situated step, latching or abutment surface 118. Similarly, the free end of arm 80 is provided with a forwardly disposed cam like surface 120 and a rearwardly situated step, latching or abutment surface 122. A pair of journal or pivot support members 124 and 126 are also preferably integrally formed with wall member 76 as to extend rearwardly therefrom. Such pivot support members 124 and 126 are respectively provided with pivot recesses or apertures 128 and 130 and are somewhat resiliently deflectable from each other for a purpose to be explained.

The switching lever means 86 is illustrated as comprising a lever portion 132 integrally formed with a main body portion 134 which at its upper and lower ends is respectively provided with pivot members or portions 136 and 138 respectively pivotally received in apertures 128 and 130 of journal supports 124 and 126.

Figure 7:
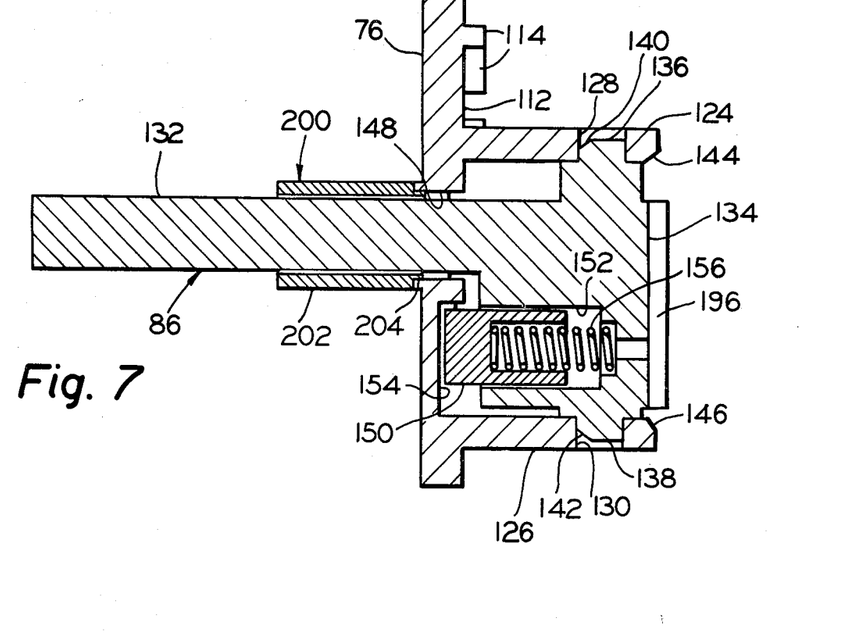
FIG. 7 is a cross-sectional view taken generally on the plane of line 7—7 of FIG. 6 and looking in the direction of the arrows.

As best seen in each of FIGS. 6 and 7, a portion of each of pivots 136 and 138 is chamfered as at 140 and 142 while a coacting portion of each of journal supports 124 and 126 is also chamfered as at 144 and 146. By providing such chamfers and providing for a degree of resilient deflection in journal arms or supports 124 and 126 it then becomes possible to assemble switch member body 134 to forward wall member 76 merely by bringing chamfers 140 and 144 into operative engagement and simultaneously bringing chamfers 142 and 146 into cooperative engagement and then pushing the switch body 134 toward the front wall member 76 causing the upper and lower journal supports 124 and 126 to resiliently deflect away from each other until such time as pivots 136 and 138 are respectively aligned for reception within apertures or pivot recesses 128 and 130 at which time the journal support arms 124 and 126, in effect, snap back toward each other to the position depicted in FIGS. 6 and 7. As best seen in FIG. 7, an aperture 148 formed in the forward wall member 76 accommodates the passage therethrough of lever portion 132.

The switch body 134 is formed with a recess 152 which, in turn, slidably receives a plunger-like member 150 and resilient or spring means 156 resiliently urging the plunger 150 against cooperating detent recess means 154 formed as in the front wall member 76. As will become evident, plunger 150 serves to resiliently urge body 134 and lever 132 to a neutral position as depicted in, for example, FIGS. 3 and 5.

Figure 8:
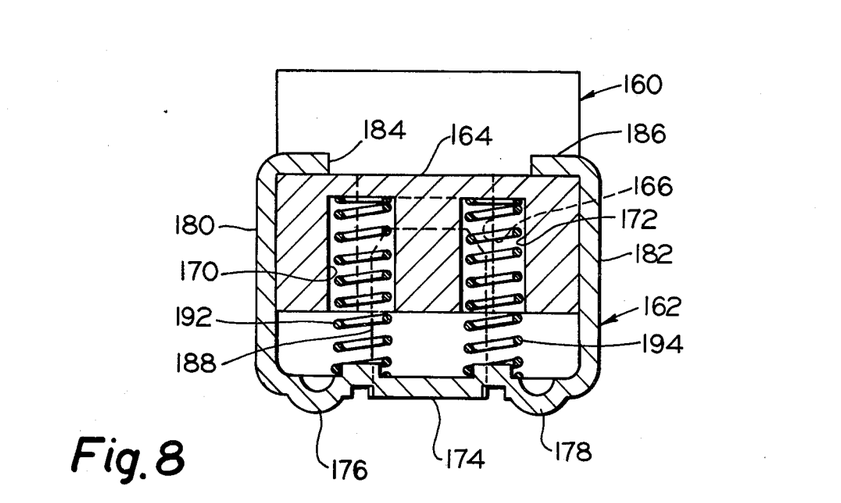
FIG. 8 is a relatively enlarged cross-sectional view taken generally on the plane of line 8—8 of FIG. 5 and looking in the direction of the arrows.

Switch body 134, as depicted in FIGS. 3, 5 and 6, has an integrally formed arm portion 158, provided as with a gusset 159, extending generally laterally of body 134, terminating in a body-like portion 160 carrying electrically conductive contact means 162. As can be seen in FIGS. 5, 6 and 8, contact carrying body 160 is provided with a generally transversely extending slot 164 along with two recess-like or pocket portions 166 and 168, situated generally at opposite sides of the slot 164, as well as two recesses 170 and 172. The contact means 162 is illustrated as preferably comprising a lower disposed bridging-like contact portion 174 having downwardly depending integrally formed contacting portions 176 and 178, spaced from each other, with such portion 174, in turn, having integrally formed arm-like portions 180 and 182 which are closely formed about the exterior of contact body 160 and which have their respective upper ends 184 and 186 bent generally toward each other as to be movably confined within slot 164. A second pair of guide-like arms 188 and 190 are integrally formed as with the medial portion of bridging contact portion 174, at opposite sides thereof, and are respectively slidably received within guide like recesses 166 and 168. A pair of springs 192 and 194, respectively received in recesses 170 and 172, operatively engage the bridging-like portion 174 of contact means 162 as to continually resiliently urge such bridging portion 174 and contacting portions 176 and 178 away from the contact carrying body 160.

Preferably the entire switch member 86, comprising lever 132, body 134, arm 158 and contact carrying body 160, is molded of a dielectric translucent material so that the lever 132 will exhibit a lens-like glow as when a source of light is placed as at the opoposite end thereof as, for example, near the opposite end of body 134. In order to enhance the light gathering qualities of the body 134 for transmission through lever 132, the rear of inner-most surface 196 of body 134 is preferably formed as to be of a trough-like or cylindrical-sector configuration thereby presenting an effectively enlarged light-gathering surface to the related light source to be described.

Figure 9:
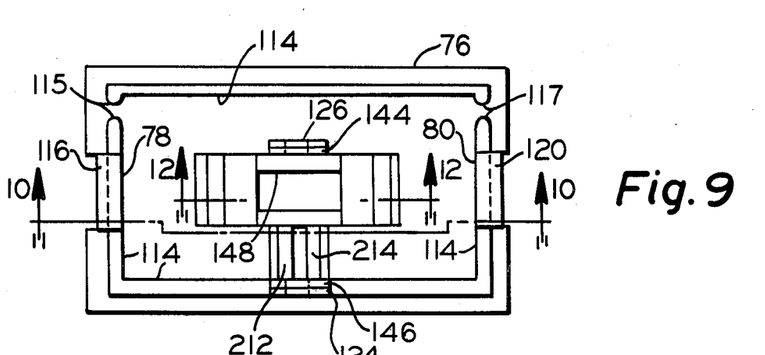
FIG. 9 is a view similar to that of FIG. 6 except that certain of the elements illustrated in FIG. 6 are not shown and the view is in relatively smaller scale.
Figure 11:
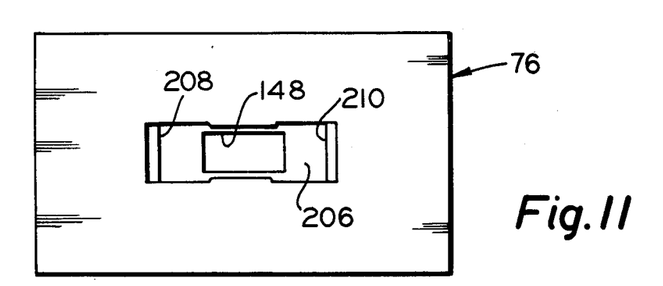
FIG. 11 is an elevational view taken generally on the plane of line 11—11 of FIG. 10 and looking in the direction of the arrows.
Figure 12:
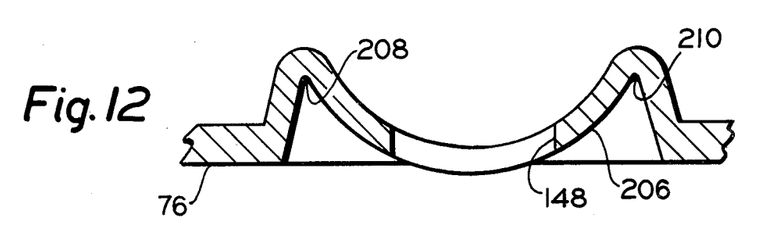
FIG. 12 is an enlarged fragmentary cross-sectional view then generally on the plane of line 12—12 of FIG. 9 and looking in the direction of the arrows.

In the preferred embodiment of the invention, the switch lever member 132 is provided with a shield member 200 comprising a tubular portion 202 and a generally rectangular portion 204 which is bowed as to have a curvilinear configuration when viewed as in FIG. 5. As best seen in FIGS. 9, 11 and 12, the front wall or cover member 76 has a preferably cylindrical wall surface portion 206 through which is formed the relatively elongated aperture 148 and which extends into pocket-like chambers 208 and 210 situated generally on either side of the aperture 148. The shield 200 is generally tightly received onto lever 132, as by a frictional engagement of the lever 132 within tubular portion 202, and when assembled, as generally depicted in FIG. 5, the inner arcuate surface 212 of curved portion 204 is brought into juxtaposition with surface 206 thereby effectively closing or covering the space which may exist as between the limits of aperture 148 and the lever 132 passing therethrough. As lever 132 is rotated generally counterclockwise about the axis of pivot 136 in FIG. 5, the curved portion 204 of shield member 200 would travel about the curved surface 206 generally toward pocket 210 (shown in FIG. 12). As lever 132 is rotated generally clockwise about the axis of pivot 136 in FIG. 5, the curved portion 204 of shield member 200 would travel about the curved surface (FIG. 12) generally toward pocket 208. In each of such travels the arcuate length of curved portion 204 is sufficient to maintain aperture 148 covered.

Figure 10:
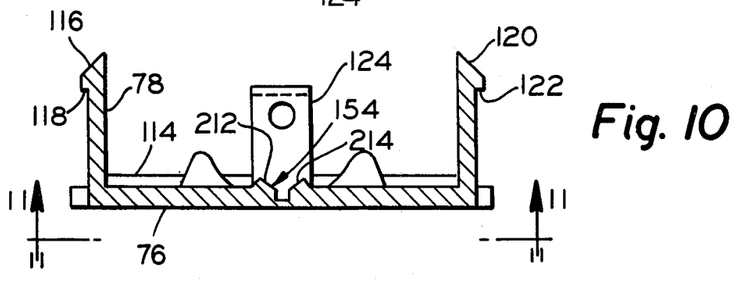
FIG. 10 is a cross-sectional view taken generally on the plane of line 10—10 of FIG. 9 and looking in the direction of the arrows.

FIG. 10 also illustrates in greater detail a preferred form of the recess detent means 154 which, as depicted therein, comprises oppositely inclined ramp-like surfaces 212 and 214 for engaging the detent plunger 150 and resiliently urging switch means 86 to a position whereat plunger 150 is disposed between such surfaces 212 and 214.

Figure 13:
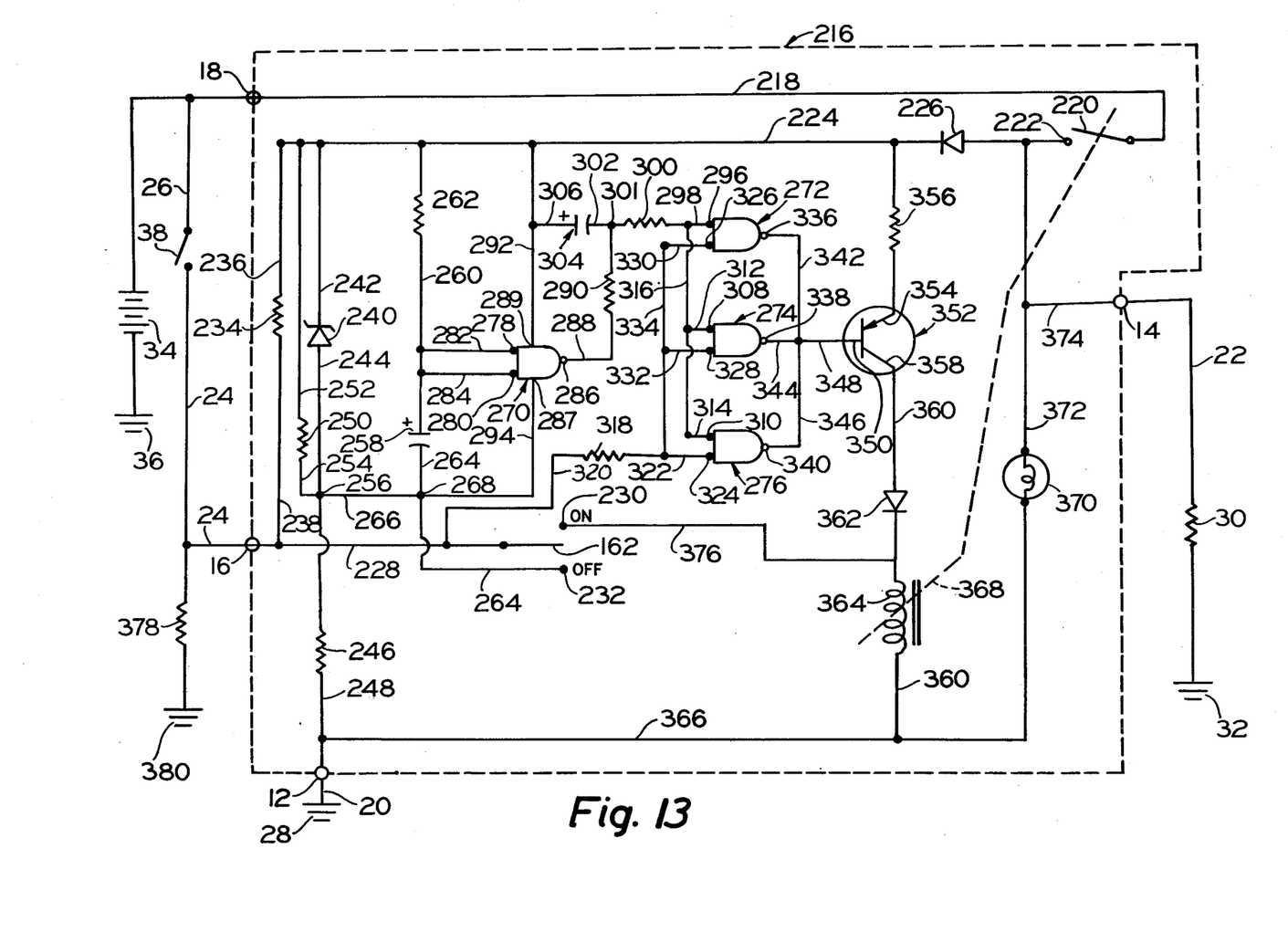
FIG. 13 is a schematic wiring diagram of electrical circuitry employable in practicing the invention.

FIG. 13 illustrates, schematically, circuitry employable in practicing the invention. The circuitry 216 is illustrated as comprising conductor means 218 electrically interconnecting terminal 18 with one side of a relay operated normally open switch member 220 effective when closed as against contact 222 as to thereby complete a circuit therethrough and to a conductor means 224 electrically connected to contact 222 and serially containing a diode 226 therein.

Therminal 16 is electrically connected as by conductor means 228 with manually actuatable switch means 162 which, when moved to an up position (as viewed in FIG. 13), electrically closes against contact 230 and when to a down position electrically closes against contact means 232.

A first resistance 234, as via conductor means 236 and 238, is placed electrically across conductors 224 and 228. A zener diode 240, electrically connected to conductor means 224 as by a conductor 242, is electrically connected via conductor means 244 to resistance means 246 which, in turn, is electrically connected as via conductor means 248 to terminal 12 and ground 28. A resistance 250 is connected via conductor means 252 to conductor 224 and, via conductor 254, to conductor means 244 as at a point 256 generally between zener 240 and resistance 246.

A capacitor 258 has its one electrical side electrically connected as via conductor means 260 and resistance means 262 to conductor 224 while its other electrical side is electrically connected via conductor means 264 to switch contact means 232. A conductor 266 electrically interconnects conductors 244 and 264 as by being electrically connected thereto respectively at 256 and 268.

Elements 270, 272, 274 and 276 comprise a "Quad 2-Input NAND Gate" with each of such elements comprising an integrated circuit. In actual practice, the elements 270, 272, 274 and 276 are integrated into a single component so that the required internal power when supplied to one of the elements is also supplied to the remaining elements via internal circuitry. Gate 270 has both of its input terminals 278 and 280 respectively electrically connected as via conductor 282 and 284 to conductor 260 as between resistor 262 and capacitor 258 while its output terminal 286 is electrically connected via conductor means 288 to resistor means 290. The power supply to gate 270 (and therefore gates 272, 274 and 276) is provided as via conductor means 292 electrically connected to conductor means 224 and conductor means 294 electrically connected to as to point 256 of conductor means 244 as through conductor means 266.

Gate 272 has its input terminal 296 electrically connected as via conductor means 298 to a resistor 300 which, in turn, as through conductor means 302 is electrically connected to one electrical side of a capacitor 304 which has its other electrical side connected as via conductor means 306 to conductor means 292. As depicted, the other electrical end of resistor 290 is electrically connected to conductor means 302 as at a point between capacitor 304 and resistor 300. Input terminals 308 and 310, respectively, of gates 274 and 276 are electrically connected, as via conductor means 312, 314 and 316 to conductor means 298 as at a point generally between terminal 296 of gate 272 and resistor 300.

A resistor 318, which is connected at one end via conductor means 320 to conductor means 228, is electrically connected at its other end via conductor means 322 to input terminal 324 of gate 276. Input terminals 326 and 328, respectively, of gates 272 and 274 are electrically connected, as via conductor means 330, 332 and 334 to conductor means 322 as at a point generally between terminal 324 of gate 276 and resistor 318.

The output terminals 336, 338 and 340 of gates 272, 274 and 276, respectively, are electrically connected as via conductor means 342, 344 and 346 to conductor means 348 leading to the base terminal 350 of a PNP transistor 352 which has its emitter 354 electrically connected to conductor 224 as via series resistor means 356 and its collector 358 in circuit with conductor means 360, serially containing diode means 362 and relay coil means 364, leading to conductor means 366. The energization of relay coil means 364 causes closure of relay contact means 220 and 222 as generally depicted by the dash line 368. As can be seen, one end of conductor means 366 is electrically connected to conductor means 248 while the other end is electrically connected to bulb means 370. The other electrical side of bulb means 370 is electrically connected to conductor means 224 as via conductor 372. The output terminal 14 may be electrically connected as to conductor means 372 as by conductor means 374. The switch contact 230 is electrically connected as by conductor means 376 to conductor means 360 as at a point generally between diode 362 and relay coil 364.

The related vehicular accessory electrical load (or loads) is depicted as resistance means at 378 electrically connected at one end as to conductor means 24 and electrically connected as at its other end to ground 380.

Figure 14:
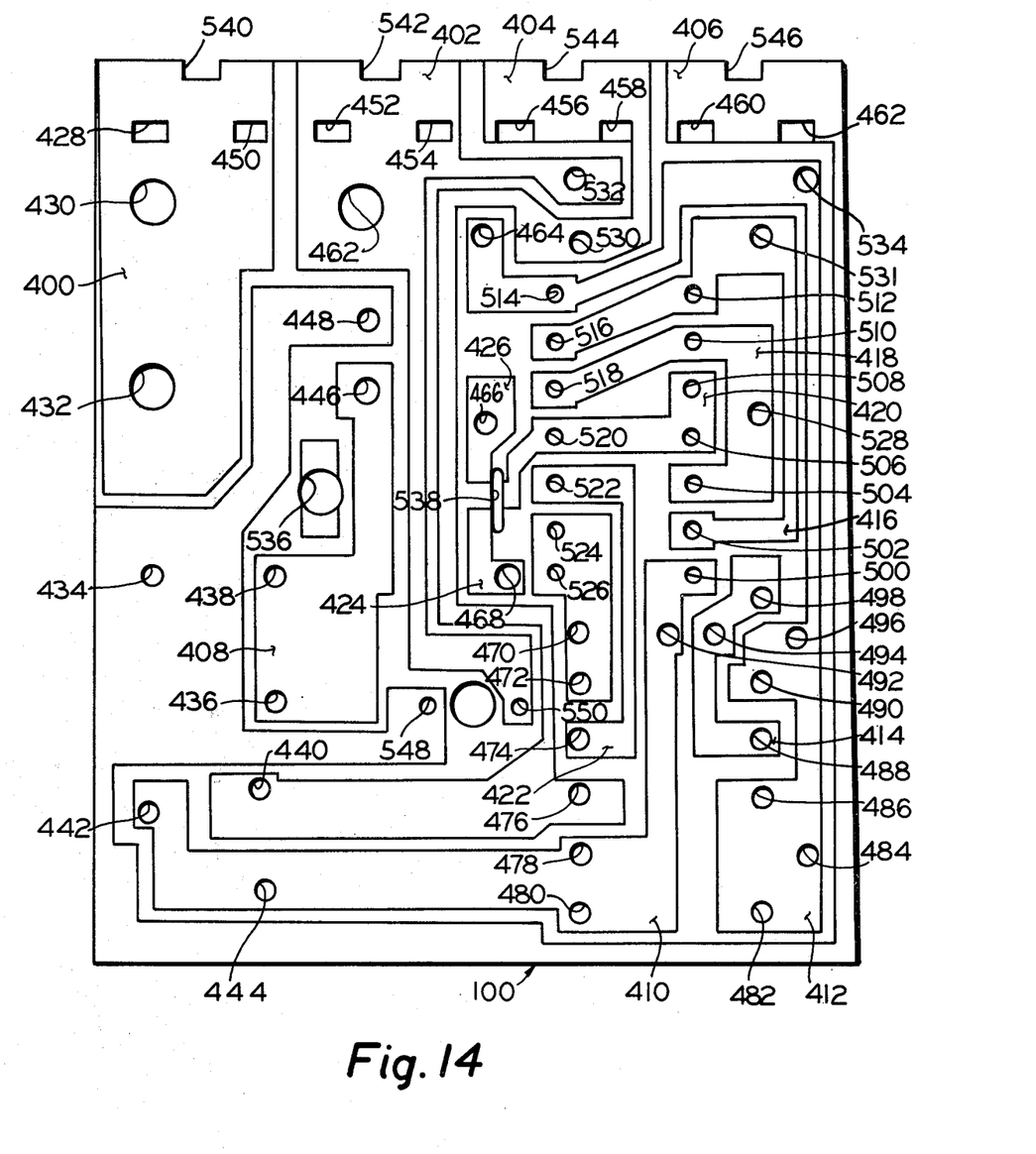
FIG. 14 is a bottom plan view of a printed circuit board employable in practicing the invention.

FIG. 14 illustrates the reverse or printed circuit side of the printed circuit board 100 of FIG. 3. As depicted, a plurality of electrically conductive printed circuit portions 400, 402, 404, 406, 408, 410, 414, 416, 418, 420, 422, 424 and 426 through which are formed, as depicted, apertures 428, 430, 432, 434, 436, 438, 440, 442, 444, 446, 448, 450, 452, 454, 456, 458, 460, 462, 464, 466, 468, 470, 472, 474, 476, 478, 480, 482, 484, 486, 488, 490, 492, 494, 496, 498, 500, 502, 504, 506, 508, 510, 512, 514, 516, 518, 520, 522, 524, 526, 528, 530, 531, 532, 534, 548 and 550. Additionally, apertures as at 536 and 538 are provided and notches 540, 542, 544 and 546 are formed.

In comparing FIGS. 3 and 14, terminal 12 has its tabs inserted into 546, 460 and 462 as to be in electrical contact with printed circuit portion 406. Terminal 14 has its tabs inserted into 456, 458 and 544 as to be in electrical contact with printed circuit portion 404. Terminal 16 has its tabs inserted into 452, 454 and 542 as to be in electrical contact with printed circuit portion 402 while terminal 18 has its tabs inserted into 428, 450 and 540 as to be in electrical contact with printed circuit portion 400.

In comparing FIGS. 13 and 14, the plus (+) side of relay coil means 364 is inserted into aperture 446 while the negative (−) or ground side thereof is inserted into aperture 448. The plus (+) side of diode 362 is inserted into aperture 468 while the negative (−) side thereof is inserted into aperture 438. The emitter 354 of transistor 352 is inserted through aperture 538 and brought into electrical contact with printed circuit portion 426, the collector thereof is also inserted through aperture 538 and brought into electrical contact with printed circuit portion 424 while the base 350 thereof is inserted through aperture 538 and brought into electrical contact with printed circuit portion 420.

Two pins formed on the frame of the relay assembly are inserted through respective apertures 430 and 432 as to be in circuit with the source of electrical potential through printed circuit portion 400 while a third pin or leg is inserted through electrically isolated aperture 536. The relay contact 222 has its lead through aperture 462 as to be in circuit with portion 402. The indicator lamp 370 has its opposite leads inserted through apertures 548 and 550 as to be in electrical circuit with portions 406 and 402. The Quad 2-input Gate 270, 272, 274 and 276 has its 326, 296, 336, 338, 308, 328, 327, 278, 280, 286, 340, 310, 324 and 289 respectively received through apertures 512, 510, 508, 506, 504, 502, 500, 526, 524, 522, 520, 518, 516 and 514 as to be in circuit with the printed circuit portions generally circumscribing such apertures. Diode 226 has its plus (+) side inserted through aperture 532 while its negative (−) side is inserted through aperture 534. Resistor 356 has one electrical end inserted through aperture 466 while its other electrical end is inserted through aperture 468.

Resistor 318 has its electrical ends respectively inserted through apertures 530 and 531. Resistor 290 has its opposite electrical ends respectively inserted through apertures 474 and 488. Capacitor 304 has its negative (−) side lead inserted through aperture 494 while its positive (+) side lead is inserted through aperture 496. Resistor 300 has its opposite electrical ends respectively inserted through apertures 498 and 528. Resistor 262 has its electrical end respectively inserted through apertures 472 and 490 while capacitor 258 has its positive (+) side lead inserted through aperture 492 and its negative (−) side lead inserted through aperture 470. Zener diode 240 has its positive (+) and negative (−) leads respectively inserted through apertures 484 and 478. Resistor 250 has its electrical leads respectively inserted through apertures 410 and 482 while resistor 234 has its electrical leads respectively inserted through apertures 476 and 486. Resistor 246 has its electrical leads respectively inserted through apertures 434 and 442. Further, rivet-like electrical terminals or contacts 552, 554 and 556 (shown in FIG. 3 and effective for securing an electrically dielectric platform member 558 to the component side of the printed circuit board 100) are respectively received through apertures 436, 440 and 440. Contact 552 is functionally equivalent to contact 230 shown in FIG. 13; contact 554 is functionally equivalent as to conductor means 228 of FIG. 13 and contact 556 is functionally equivalent to contact 232 of FIG. 13. Of course, as is well known in the art, the various inserted electrical leads, etc., are electrically connected to the associated printed circuit portion as by, for example, soldering.

Operation of Invention

Generally, as viewed in, for example, FIG. 1, when the switch lever means 86 is actuated to the position depicted at 86-1, the entire circuitry and system becomes energized and, if during such time of energization the switch control means 86 is actuated to the position depicted at 86-2, the entire circuitry and system becomes de-energized.

More specifically, referring to FIG. 13, and assuming the vehicular ignition switch means 38 to be closed, to start the operation of the invention, switch control means 86 is actuated causing switch movable contact means 162 to momentarily close against contact 230 thereby supplying electrical power to relay coil means 364 and consequently moving relay movable contact means 220 closed against fixed contact means 222 thereby completing a circuit through conductor means 218, 372 and 374 and diode 226 to conductor means 224. This, in turn, means that the indicator lamp means 370 as well as the related vehicular backlight or rear window heater means 30 are energized.

Zener diode 240 provides for a substantially constant and fixed voltage reference as across conductor means 224 and 266 which, in the embodiment under consideration is 6.8 volts. As can be seen, the 6.8 volts is applied to the integrated circuit means 270, 272, 274 and 276 as by conductor means 292, 294 and associated terminals 289 and 287. Initially, upon switch contact 220 closing, capacitor 258 has no charge on it and begins to charge through resistor 262 only upon such initial closure of contact means 220 and 222. During the time that capacitor 258 is thusly charging relatively "low" signals are applied, via conductor means 282 and 284 to respective input terminals 278 and 280 of inverter 270 thereby producing a relatively "high" output at terminal 286 of the inverter 270. The "high" voltage output at 286 is applied to resistor 290 and since capacitor 304 is also, initially, discharged, the relatively "high" voltage signal remains "high" with the result that no charging of the capacitor 304 takes place. The "high" voltage signal as then exists as at point 301 is applied via resistor 300 and conductor means 298 to the input terminal 296 of inverter 272 and, simultaneously, via conductor means 316, 312 and 314 is also applied to input terminals 308 and 310 of integrated circuit portions or inverters 274 and 276, respectively. Also, at this time, since the vehicular ignition switch 38 has been assumed closed, a circuit is completed from conductor 24 to conductors 228 and 320, resistor 318 and via conductor 322 to input terminal 324 of inverter 276 thereby placing a "high" signal on input 324. Simultaneously, via conductor means 334, 332 and 330 the same "high" signal is applied to input terminals 328 and 326 of inverters 274 and 272, respectively.

Consequently, with all of the inputs of inverters 272, 274 and 276 experiencing a "high" signal, the respective output terminals 336, 338 and 340 will each produce a "low" output signal which is transmitted via conductor means 348 to the base terminal 350 of PNP transistor 352 thereby placing transistor 352 into conduction so that current flow passes through resistor 356, emitter 354, collector 358, diode 362 relay coil means 364 and to ground 28 as through conductor means 360, 366 and 20. The turning-on of transistor 352 serves to maintain relay coil means 364 energized and relay switch contact means 220, 222 closed even when the manually actuatable switch contact means 162 is, after momentarily closing against contact 230, moved to an open position with respect thereto.

During this time capacitor 258 is undergoing charging and when the charge thereacross reaches a value of approximately six-tenths of the voltage across the integrated circuit (as supplied via conductors 292, 294) the value of the voltage on conductor 260 and conductors 282 and 284 becomes sufficient to serve as a "high" signal and such is applied to both input terminals 278 and 280 of inverter 270 thereby causing the output thereof at output terminal 286 to become "low". This "low" signal then permits capacitor 304 to undergo charging the rate of which is controlled by resistor 290. When capacitor 304 is sufficiently charged point 301 will appear as a "low" voltage signal which is applied as via resistor 300 and conductor means 298, 316, 312 and 314 to input terminals 296, 308 and 310 of inverters 272, 274 and 276, respectively. At this time it can be seen that input terminals 326, 328 and 324 of inverters 272, 274 and 276 are experiencing a "high" signal while the coacting input terminals 296, 308 and 310 have a "low" signal. Consequently, with unlike signals on respective ones of the coacting pairs of input terminals, the output at terminals 336, 338 and 340 will become "high" and such is, in turn, effective for turning-off transistor 352 as to terminate conduction therethrough de-energizing relay coil means 364 and opening relay coil means 364 and opening relay contact means 220 and 222 which removes or terminates current flow to the indicator lamp 370 and load 30. In the above circuit description, it can be seen that the timing means comprises capacitor means 258 and resistor means 262. In one successful embodiment of the invention, capacitor 258 and resistor 262 were selected as to provide for a 10.0 minute time span after initial closure of the manually actuatable switch contact means 162 and before subsequent deenergization of the transistor 352 and consequent opening of relay contact means 220 and 222.

Now, let it be assumed that the circuitry described has been energized as already described but that the timing means has not yet caused the opening of relay contact means 220 and 222. If at this time the manually actuatable switch contact means 162 is moved to a closed position against terminal 232, the relatively "high" voltage signal from conductor 24 is applied via conductor means 228, 264 and 294 to terminal 287 of the integrated circuitry thereby, in effect, placing terminals 289 and 287 at generally the same voltage and effectively removing internal power therefrom and making the integrated circuitry 270, 272, 274 and 276 non-functional resulting in transistor 352 being made non-conductive. As previously described, when transistor is made non-conductive relay coil means 364 is deenergized and relay contact means 220 and 222 are opened.

Further, resistor means 250 is electrically between terminals 289 and 287 of the integrated circuitry as depicted in portion 270 thereof. Internally of the integrated circuit are diodes placed as between each of the input terminals and the positive (+) terminal 289. Consequently, when power is removed from the integrated circuit, the voltage or charge on the capacitor 258 will be reduced because there will be current flow through such internal diodes at the inputs of the integrated circuitry as through terminal 278 to and through terminal 289 through resistor 250 and back to the negative side of capacitor 258. Such comprises the discharge path for the capacitor 258 upon either completion of a timed cycle or upon interruption of the cycle by the momentary closure of switch member 162 against contact 232.

If the circuitry as described above has completed a timed cycle or has had such timed cycle interrupted by the momentary closure of switch contact means 162 and 232, and the ignition switch 38 has remained closed, capacitor 258 will be limited as to the amount of discharge thereof which can occur. This is as a consequence of the voltage divider network comprised of resistors 234, 250 and 246, so that when the ignition switch remains closed and the integrated circuitry is shut-down, in the embodiment under consideration, the capacitor 258 will only discharge approximately halfway. Accordingly, if after the initial cycle of heating the backlight, as via load or heater means 30, for ten minutes, the vehicle operator desires further heating of the backlight and consequently again energizes the circuitry by actuation of the manual switching means, as described, such subsequent heating cycle will last for only in the order of five minutes because the timing capacitor 258 is already approximately still half-charged from the immediately preceeding cycle. Of course, the degree of discharge can be selected by the selection of appropriate values of resistance means 234, 250 and 246. Further, if resistance means 234 should be eliminated from the circuitry, each cycle time would be the same regardless of whether the ignition switch remained closed.

The accessory electrical load 378, usually existing in all vehicles and, if not, such load equivalent to 378 could be made internally of the circuitry 216, provides a further function in cooperation with the ignition switch means 38. That is, when ignition switch 38 is opened, load means 378 causes, via conductor means 24, -228, 320, resistor 318, conductor means 322, 334, 332 and 330, input terminals 324, 328 and 326 to appear as having "low" signal voltages thereby, as previously described, causing "high" outputs at 336, 338 and 340 and turning-off transistor 352. This assures that upon engine shut-down, as indicated by the opening of the ignition switch 38, the relay contact means will be opened and no power will be taken as from the associated vehicular storage battery.

In one particularly successful embodiment of the invention, the following elements had the respectively indicated values:

Resistor 234: ¼ watt; 5.6K
Resistor 250: ¼ watt; 1.2K
Resistor 246: ½ watt; 120 ohms
Resistor 262: ¼ watt; 2.4 Meg.
Resistor 300: ¼ watt; 1.2K
Resistor 290: ¼ watt; 100K
Resistor 318: ¼ watt; 100K
Resistor 356: ¼ watt; 10 ohms Integrated circuit portions 270, 272, 274 and 276 were actually comprised of a type MC14011UB, quad 2-input "NAND" gate (with internal diodes), manufactured by Motorola Semiconductor Products, Inc. and described as at Page 7-32 in the publication entitled "Motorola CMOS Integrated Circuits" and bearing a U.S. of America copyright notice by Motorola, Inc., 1978; transistor means 352 was type MPS-D55-PNP manufactured by Motorola Semiconductor Products, Inc. and described in the publication entitled "The Semiconductor Data Library, Series A, Volume 3" and bearing a U.S. of America copyright notice by Motorola, Inc., 1974; capacitor 258 was 220 μf at 16 volts; capacitor 304 was 47 μf at 10 volts; zener diode 240 was type 1N5235A and diodes 226 and 362 were type 1N4001.

If further clarificaton is needed, terminals 326, 296, 336, 338, 308, 328, 287, 278, 280, 286, 340, 310, 324 and 289 correspond respectively to pins or terminals 1, 2, 3, 4, 5, 6, 7, 8, 9, 10, 11, 12, 13 and 14 of the said quad 2-input "NAND" gate as depicted in on said Page 7-32 of said publication "Motorola CMOS Integrated Circuits".

Figure 15:
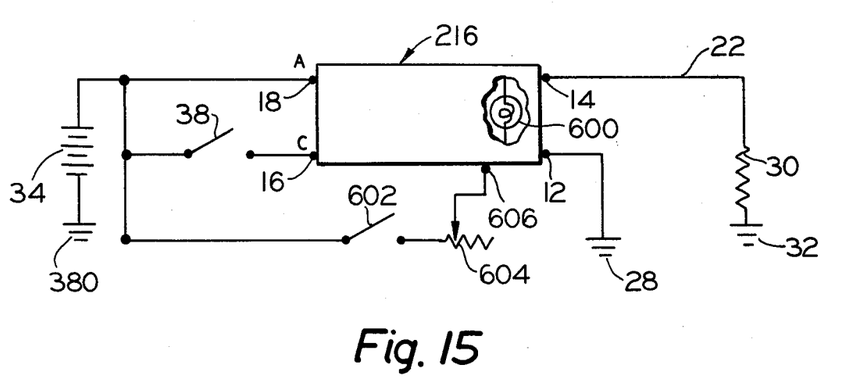
FIG. 15 is a schematic wiring diagram of modified electrical circuitry employable in practicing the invention.
Figure 16:
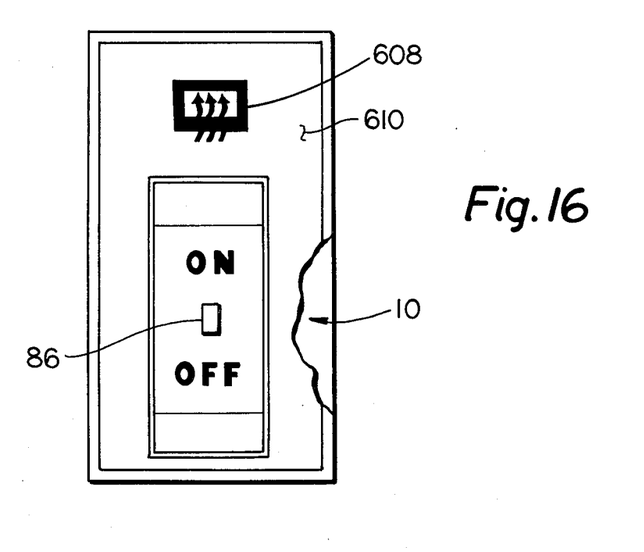
FIG. 16 is an elevational view of an assembly of the invention illustrating a modification of that shown in, for example, FIG. 2.

FIG. 15 illustrates a modification of the invention wherein a second bulb 600 is provided which may be controlled (energized) as through the vehicular headlamp switch means 602 and rheostat 604 as through additional terminal or conductor means 606. Of course, the second bulb 600 could be simply in parallel with bulb means 370.

The purpose of such second bulb 600 is to provide for visual control identification as through illumination of a related symbol-carrying lens or the like situated in close proximity to the manually actuatable switching means as generally depicted by a lens 608 which may be carried as by a decorative portion 610 situated forwardly of the assembly 10 which, in turn, may be provided with a light passing opening aligned with such lens 608.

Although only a preferred embodiment and selected modifications of the invention have been disclosed and described, it is apparent that other embodiments and modifications of the invention are possible within the scope of the appended claims.

What is claimed is:

1. An electrical switching and timing assembly; comprising manually actuatable switch means selectively closable and openable; circuit means having an input end and an output end; said input end being adapted for electrical connection to a source of electrical potential; said output end being adapted for electrical connection to associated electrical load means; said circuit means comprising electrical timing means effective for opening said circuit means upon the expiration of a preselected span of time after said circuit means has been closed by said manually actuatable switch means; and wherein said manually actuatable switch means, said circuit means, said input and output ends and said timing means are carried by unitized support structure; said unitized support structure comprising first, second, third and fourth integrally formed side walls and a back wall integrally joined to said side walls and extending generally transversely thereof as to thereby effectively form a closed back end of said support structure; said first, second, third and fourth side walls cooperating to define a generally main housing portion having an open front end generally opposite to said back end; printed circuit board means receivable within the space defined by said main housing portion; said printed circuit board means being insertable into said space and withdrawable from said space through said open front end; said printed circuit board means carrying said circuit means; said circuit means comprising electrical relay means also carried by said printed circuit board means; said input end of said circuit means comprising relatively rigid first terminal means carried by said printed circuit board means and extending through said back wall; said output end of said circuit means comprising relatively rigid second terminal means carried by said printed circuit board means and extending through said back wall; said manually actuatable switch means comprising switch contact means and a manually positionable switch lever; said switch contact means being carried by said printed circuit board means; a front wall for effectively closing said open front end; said front wall pivotally carrying said manually positionable switch lever; said front wall with said manually positionable switch lever carried thereby being detachably securable to said main housing portion as to effectively close said open front end and place said manually positionable switch lever in position for operative engagement with said switch contact means; said front wall with said manually positionable switch lever carried thereby being detachable and removable from said main housing portion without causing withdrawal of said printed circuit board means from said space.

2. An electrical switching and timing assembly according to claim 1 and further comprising an electrically energizable light generating source carried by said printed circuit board means and being withdrawable with said printed circuit board means from said space only after said front wall is detached and removed from said main housing portion thereby presenting said open front end for the subsequent separate withdrawal therethrough of said printed circuit board means, said light generating source being electrically energized to produce a light signal whenever said circuit means is closed.

3. The combination of an automotive vehicle and a backlight heater and timing control means; wherein said vehicle comprises a backlight with electrically energizable heater means associated therewith and vehicle-engine energizing switch means; and wherein said backlight heater and timing control means comprises an electrical switching and timing assembly; said electrical switching and timing assembly comprising manually actuatable second switch means selectively closable and openable; circuit means having an input end and an output end; said input end being electrically connected to said vehicle-engine energizing switch means and to a source of electrical potential; said output end being operatively electrically connected to said heater means; said circuit means comprising electrical timing means effective for opening said circuit means upon the expiration of a preselected span of time after said circuit means has been closed by said manually actuatable second switch means; and wherein said manually actuatable second switch means, said circuit means, said input and output ends and said timing means are operatively carried by unitized support structure; said unitized support structure comprising first, second, third and fourth integrally formed side walls and a back wall integrally jointed to said side walls and extending generally transversely thereof as to thereby effectively form a closed back end of said support structure; said first, second, third and fourth side walls cooperating to define a generally main housing portion having an open front end generally opposite to said back end; printed circuit board means receivable within the space defined by said main housing portion; said printed circuit board means being insertable into said space and withdrawable from said space through said open front end; said printed circuit board means carrying said circuit means, said circuit means comprising electrical relay means also carried by said printed circuit board means; said input end of said circuit means comprising relatively rigid first electrical terminal means carried by said printed circuit board means and extending through said back wall; said output end of said circuit means comprising relatively rigid second electrical terminal means carried by said printed circuit board means and extending through said back wall; said manually actuatable second switch means comprising switch contact means and a manually positionable switch lever; said switch contact means being carried by said printed circuit board means; a front wall for effectively closing said open front end; said front wall pivotally carrying said manually positionable switch lever; said front wall with said manually positionable switch lever carried thereby being detachably securable to said main housing portion as to effectively close said open front end and place said manually positionable switch lever in position for operative engagement with said switch contact means; said front wall with said manually positionable switch lever carried thereby being detachable and removable from said main housing portion without causing withdrawal of said printed circuit board means from said space.

4. The combination according to claim 3 and further comprising an electrically energizable light generating source carried by said printed circuit board means as to be situated within said space of said main housing portion and be both insertable and withdrawable in unison with said printed circuit board means into and out of said space only after said front wall is first detached and removed from said main housing portion thereby presenting said open front end for the subsequent separate insertion or withdrawal therethrough of said printed circuit board means, said light generating source being electrically energized to produce a light signal whenever said circuit means is closed.

5. An electrical switching and timing assembly according to claim 1 wherein said printed circuit board means comprises a single board contained in first and second opposite directions by two of said side walls which are opposed to each other and contained in third and fourth directions generally normal to said first and second directions by said back wall and said front wall, wherein said back wall serves as an abutment to thereby limit the relative movement of said single board in said third direction, and wherein said front wall is effective for serving to limit relative movement of said single board only in said fourth direction opposite to said third direction.

6. An electrical switching and timing assembly according to claim 1 wherein said first and third side walls are opposed to each other, wherein said first side wall comprises a first inner surface, wherein said third side wall comprises a second inner surface, wherein said first and second inner surfaces are generally opposed to each other, and further comprising first guide means carried by said first inner surface, second guide means carried by said second inner surface, and wherein said printed circuit board means is operatively engaged with and guided by said first and second guide means.

7. An electrical switching and timing assembly according to claim 1 wherein said first and third side walls are opposed to each other, wherein said second and fourth side walls are opposed to each other, wherein said first side wall comprises a first inner surface, wherein said third side wall comprises a second inner surface, wherein said first and second inner surfaces are generally opposed to each other, and further comprising first guide means carried by said first inner surface, second guide means carried by said second inner surface, wherein said printed circuit board means is operatively engaged with said first and second guide means, and wherein said first and second guide means function to hold said printed circuit board means from undue movement toward either said second or fourth side walls.

8. An electrical switching and timing assembly according to claim 2 wherein said printed circuit board means comprises a single board contained in first and second opposite directions by two of said side walls which are opposed to each other and abutingly contained in directions generally normal to said first and second directions by said back wall and said front wall.

9. An electrical switching and timing assembly according to claim 2 wherein said first and third side walls are opposed to each other, wherein said first side wall comprises a first inner surface, wherein said third side wall comprises a second inner surface, wherein said first and second inner surfaces are generally opposed to each other, and further comprising first guide means carried by said first inner surface, second guide means carried by said second inner surface, and wherein said printed circuit board means is operatively engaged with and guided by said first and second guide means.

10. An electrical switching and timing assembly according to claim 2 wherein said first and third side walls are opposed to each other, wherein said second and fourth side walls are opposed to each other, wherein said first side wall comprises a first inner surface, wherein said third side wall comprises a second inner surface, wherein said first and second inner surfaces are generally opposed to each other, and further comprising first guide means carried by said first inner surface, second guide means carried by said second inner surface, wherein said printed circuit board means is operatively engaged with said first and second guide means, and wherein said first and second guide means function to hold said printed circuit board means from undue movement toward either said second or fourth side walls.

11. The combination according to claim 3 wherein said printed circuit board means comprises a single board contained in first and second opposite directions by two of said side walls which are opposed to each other and contained in directions generally normal to said first and second directions by said back wall and said front wall.

12. The combination according to claim 3 wherein said first and third side walls are opposed to each other, wherein said first side wall comprises a first inner surface, wherein said third side wall comprises a second inner surface, wherein said first and second inner surfaces are generally opposed to each other, and further comprising first guide means carried by said first inner surface, second guide means carried by said second inner surface, and wherein said printed circuit board means is operatively engaged with and guided by said first and second guide means.

13. The combination according to claim 3 wherein said first and third side walls are opposed to each other, wherein said second and fourth side walls are opposed to each other, wherein said first side wall comprises a first inner surface, wherein said third side wall comprises a second inner surface, wherein said first and second inner surfaces are generally opposed to each other, and further comprising first guide means carried by said first inner surface, second guide means carried by said second inner surface, wherein said printed circuit board means is operatively engaged with said first and second guide means, and wherein said first and second guide means function to hold said printed circuit board means from undue movement toward either said second or fourth side walls.

14. The combination according to claim 4 wherein said printed circuit board means comprises a single board contained in first and second opposite directions by two of said side walls which are opposed to each other and contained in directions generally normal to said first and second directions by said back wall and said front wall.

15. The combination according to claim 4 wherein said first and third side walls are opposed to each other, wherein said first side wall comprises a first inner surface, wherein said third side wall comprises a second inner surface, wherein said first and second inner surfaces are generally opposed to each other, and further comprising first guide means carried by said first inner surface, second guide means carried by said second inner surface, and wherein said printed circuit board means is operatively engaged with and guided by said first and second guide means.

16. The combination according to claim 4 wherein said first and third side walls are opposed to each other, wherein said second and fourth side walls are opposed to each other, wherein said first side wall comprises a first inner surface, wherein said third side wall comprises a second inner surface, wherein said first and second inner surfaces are generally opposed to each other, and further comprising first guide means carried by said first inner surface, second guide means carried by said second inner surface, wherein said printed circuit board means is operatively engaged with said first and second guide means, and wherein said first and second guide means function to hold said printed circuit board means from undue movement toward either said second or fourth side walls.

* * * * *

UNITED STATES PATENT AND TRADEMARK OFFICE
CERTIFICATE OF CORRECTION

PATENT NO. : 4,378,503

DATED : March 29, 1983

INVENTOR(S) : Norman A. Rautiola

It is certified that error appears in the above—identified patent and that said Letters Patent is hereby corrected as shown below:

Column 2, line 57 after "view" cancel "then" and substitute therefor --- taken ---.

Column 3, line 43 cancel "composed" and substitute therefor --- comprised ---.

Column 6, line 50 cancel "Therminal" and substitute therefor --- Terminal ---.

Column 14, line 1, change "jointed" to --- joined ---.

Signed and Sealed this

Nineteenth Day of July 1983

[SEAL]

Attest:

GERALD J. MOSSINGHOFF

Attesting Officer        Commissioner of Patents and Trademarks